(12) United States Patent
Shaikh et al.

(10) Patent No.: US 12,740,017 B2
(45) Date of Patent: Sep. 15, 2026

(54) VAPOR CHAMBER WITH DYNAMICALLY ADJUSTABLE LOCAL EVAPORATIVE RESISTANCE

(71) Applicant: Intel Corporation, Santa Clara, CA (US)

(72) Inventors: Javed Shaikh, Bangalore (IN); Kathiravan Dhandapani, Bangalore (IN); Greeshmaja Govind, Edakkara (IN); Asif S. Khan, Palakkad (IN); Bijendra Singh, Bangalore (IN); Yagnesh V. Waghela, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 17/561,916

(22) Filed: Dec. 24, 2021

(65) Prior Publication Data

US 2023/0209775 A1 Jun. 29, 2023

(51) Int. Cl.

| | |
|---|---|
| ***F28D 15/02*** | (2006.01) |
| ***F28D 15/04*** | (2006.01) |
| ***F28D 15/06*** | (2006.01) |
| ***G06F 1/20*** | (2006.01) |
| ***H05K 7/20*** | (2006.01) |

(52) U.S. Cl.

CPC ..... *H05K 7/20336* (2013.01); *F28D 15/0208* (2013.01); *F28D 15/0233* (2013.01); *F28D 15/046* (2013.01); *F28D 15/06* (2013.01); *G06F 1/20* (2013.01); *H05K 7/20381* (2013.01); *G06F 2200/201* (2013.01)

(58) Field of Classification Search

CPC ......................... F28D 15/0208; F28D 15/0233

See application file for complete search history.

(56) References Cited

U.S. PATENT DOCUMENTS

| | | | | |
|---|---|---|---|---|
| 2002/0046825 A1* | 4/2002 | Huang | H01L 23/473 257/E23.098 |
| 2012/0023969 A1* | 2/2012 | Subramaniam | F25B 21/00 62/3.1 |

* cited by examiner

*Primary Examiner* — Jianying C Atkisson
*Assistant Examiner* — Khaled Ahmed Ali Al Samiri
(74) *Attorney, Agent, or Firm* — Alliance IP, LLC

(57) ABSTRACT

Wire coils are distributed over the bottom surface of an inner chamber of a vapor chamber. The working fluid of the vapor chamber comprises ferromagnetic particles that are attracted to a wire coil as current passes through the wire coil. The resulting increase in the volumetric concentration of ferromagnetic particles in the vicinity of the activated wire coil increases the capacity of the working fluid to remove heat from an integrated circuit component attached to the vapor chamber in the region of the activated wire coil. The vapor chamber wire coils can be activated based on performance metrics associated with the processor units of an integrated circuit component, thereby allowing for the thermal resistance of the working fluid to be dynamically adjusted based on the workload executing on the integrated circuit component and power consumption transients.

25 Claims, 12 Drawing Sheets

FIG. 4
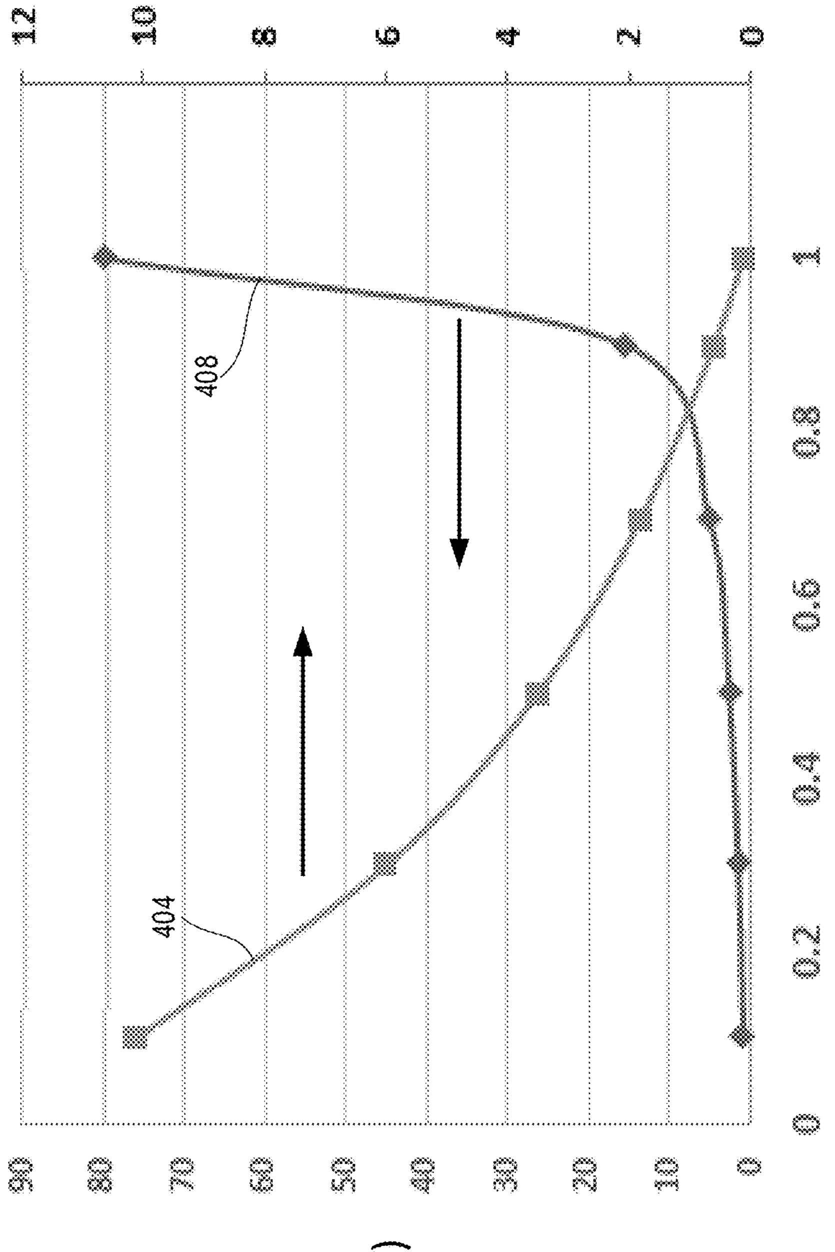
$R_{evap}$ (°K/W)
12
10
8
6
4
2
0
$k_{nf}$ (°K/W)
90
80
70
60
50
40
30
20
10
0
0
0.2
0.4
0.6
0.8
1
408
404
Ferromagnetic Particle
Volumetric Fraction
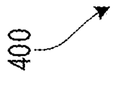
400

900

RECEIVE ONE OR MORE PERFORMANCE METRICS INDICATING THE PERFORMANCE OF ONE OR MORE PROCESSOR UNITS LOCATED IN AN INTEGRATED CIRCUIT COMPONENT 910

CAUSE CURRENT TO FLOW THROUGH ONE OR MORE WIRE COILS OF A VAPOR CHAMBER BASED ON THE PERFORMANCE METRICS. 920

VAPOR CHAMBER WITH DYNAMICALLY ADJUSTABLE LOCAL EVAPORATIVE RESISTANCE

BACKGROUND

The introduction of ferromagnetic particles in the working fluid of a vapor chamber can reduce the thermal resistance of the working fluid.

The distribution of power consumption density across the area of an integrated circuit component with heterogeneous processor units (such as graphics processing unit, compute-intensive "big core" processor units, and low-power "small core" processor units) can vary based on the workload being performed by the integrated circuit component.

BRIEF DESCRIPTION OF THE DRAWINGS

FIG. 4 is a graph showing example dependencies of working fluid thermal conductivity and vapor chamber evaporative resistance on ferromagnetic particle volumetric concentration.

DETAILED DESCRIPTION

In integrated circuit dies with heterogeneous architectures (heterogeneous dies), different types of processor units (e.g., graphics processing unit (GPU), high performance central processing units (CPUs), low-power CPUs) are integrated onto a single die. Different processor unit types are utilized as needed, often depending on the workload being executed by the heterogeneous die. Thus, different types of workloads being performed on a heterogeneous die can result in hotspots (areas of high temperature due to high power consumption levels) in different locations on the heterogeneous die. For example, a first heterogeneous die region in the vicinity of a high performance CPU can be a hotspot when the heterogeneous die is executing a compute-intensive workload and a second region of the heterogeneous die can be a hotspot when the heterogeneous die is performing a graphics-intensive workload. In some heterogeneous dies, the physical distance between hotspots associated with different workloads can be in the range of 20-33 mm for some existing heterogeneous dies and even larger for very large heterogeneous dies. The presence of hotspots can also vary over time (while staying in the same location) as the power consumption of a processor unit varies during execution of a particular workload.

Figures 1A, 1B, 1C:
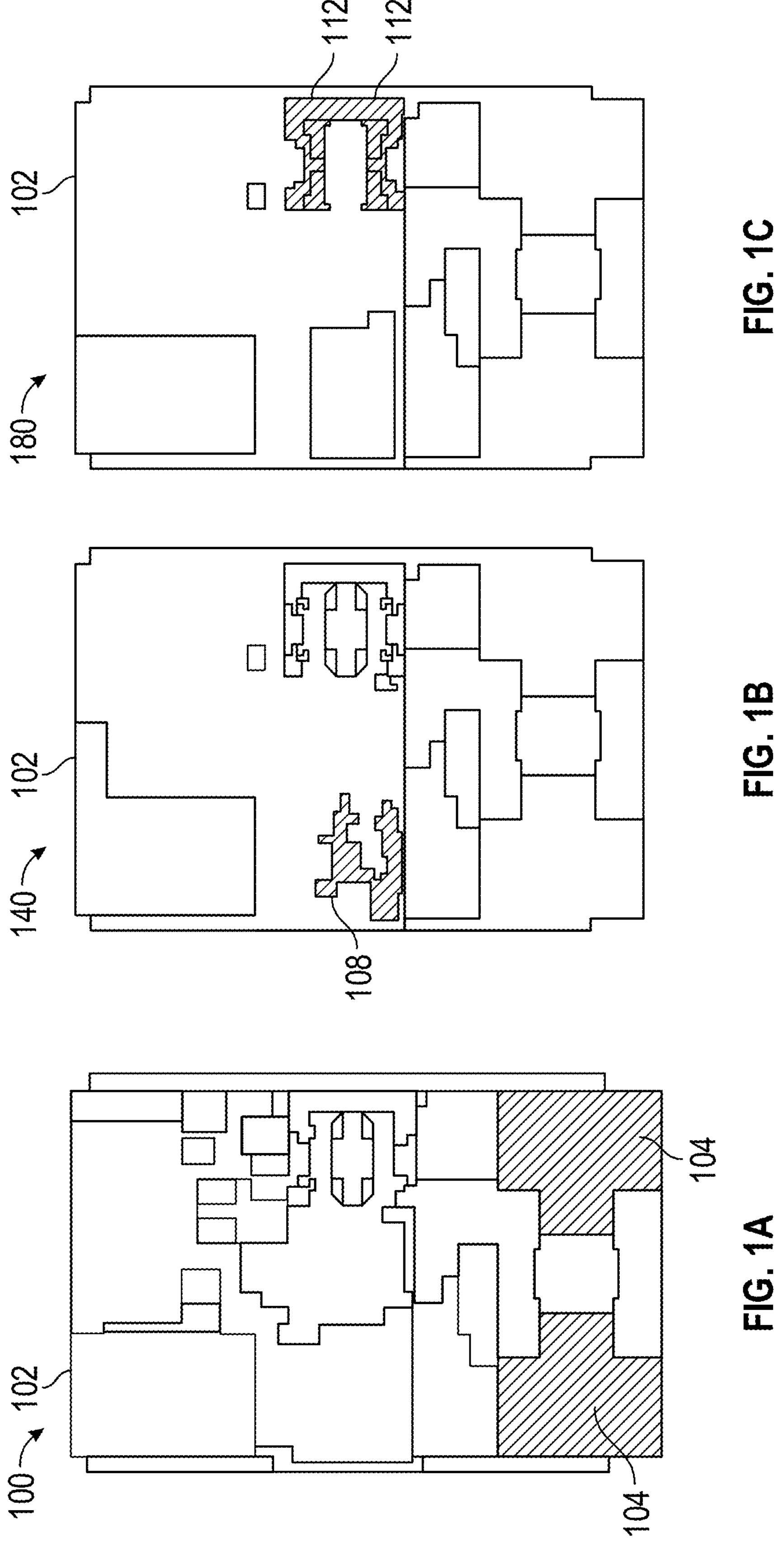
FIGS. 1A-1C illustrate example hotspot distributions across a heterogeneous die floorplan resulting from the execution of different types of workloads by the heterogeneous die.

For example, FIGS. 1A-1C illustrate example hotspot distributions across a heterogeneous die floorplan resulting from the execution of different types of workloads by the heterogeneous die. FIGS. 1A and 1B illustrate hotspot distributions 100 and 140 across a floorplan 102 of a heterogeneous die during execution of graphics-intensive and compute-intensive workloads, respectively. FIG. 1C illustrates a hotspot distribution 180 across the floorplan 102 during execution of a workload that involves heavy utilization of low-power processor units. The boundaries in the floorplan 102 represent the boundaries of various processor units of the heterogeneous die. In FIG. 1A, hotspots 104 are located where GPUs are located in the floorplan 102. In FIG. 1B, hotspot 108 is located where a high performance core capable of handling compute-intensive workloads is located. In FIG. 1C, the hotspots 112 are located where low-power cores are located.

The use of vapor chambers is one approach to thermal management of integrated circuit components but the use of existing vapor chambers to cool heterogeneous dies can have drawbacks. Heterogeneous dies require a low evaporative resistance ($R_{evap}$) (or high thermal conductivity ($k_{eff}$)) to cool hotspot regions and vapor bubbles formed in hotspot regions need to be able to escape quickly to reduce back pressure to avoid dryout (dry-off) of the vapor chamber wick in the region of the hotspot. To remove the requisite amount of heat at a hotspot to keep an integrated circuit component operating within its thermal limits, vapor chamber designs are faced with the competing demands of having a wick thick enough to allow enough working fluid to return to hotspot regions to allow for continued heat removal and having a thin vapor chamber to enable a low evaporative resistance. Additive processing approaches may enable the manufacture of thin vapor chambers that have a sufficiently low $R_{evap}$, but such manufacturing approaches can add cost and thin vapor chambers may not address the need of having a sufficiently thick wick. The difficulty in satisfying these competing demands may cause a reduction in the maximum power levels that an integrated circuit component can operate at (such as the PL2 power level for some Intel® processors) generation over generation due to increasing power consumption densities. Existing vapor chamber designs are also saddled with the limitation of having static wick structures. Because the evaporative resistance of such vapor chambers is fixed, they cannot respond to the shifting physical location of hotspots as an integrated circuit component executes different types of workloads.

Described herein are vapor chambers with dynamically adjustable local evaporative resistance. These vapor chambers comprise working fluids comprising ferromagnetic particles and wire coils located on the bottom surface of the vapor chamber inner chamber. The presence of ferromagnetic particles in the working fluid reduces the evaporative resistance of the working fluid relative to a working fluid that does not comprise ferromagnetic particles. Passing a sufficient amount of current through a wire coil creates enough magnetic flux to attract the ferromagnetic particles and the volumetric concentration of ferromagnetic particles in the vicinity of the activated wire coil (a wire coil that has current passing through it) is increased as a result. The increased volumetric concentration of ferromagnetic particles reduces the thermal resistance of the working fluid in the vicinity of the activated wire coil. The amount of increase in the volumetric concentration of ferromagnetic particles in the vicinity of an activated wire coil can increase according to the amount of current passed through the activated wire coil. Performance metrics indicating the power consumption level of processor units in a heterogeneous die can be provided to a coil controller and the coil controller can cause current to be passed through one or more wire coils positioned in the vicinity of a processor unit operating at a high level of power consumption. In some embodiments, the coil controller causes current to be passed through one of the wire coils if the power consumption of a processor unit exceeds a power consumption threshold.

Thus, the evaporative resistance of a working fluid can be dynamically adjusted to allow more heat to be removed from regions where hotspots are occurring. By attracting ferromagnetic particles to the vicinities of activated wire coils, the local wick structures are being effectively resized, which can aid in preventing dry-off conditions from occurring. The vapor chamber technologies disclosed herein are expected to allow the maximum operating power of integrated circuit components (e.g., PL2 levels) to increase by an amount of 10-15% for some integrated circuit component designs.

The evaporation of working fluid in the region of a hotspot causes vapor bubbles to form in the working fluid. If the vapor bubbles fail to migrate away from the hotspot they can cause back pressure and potentially create a dry-off condition in the region of the hotspot. The wire coils described herein, when activated, can aid in the migration of vapor bubbles from their point of formation by causing a magnetic field gradient to form from the center of a wire coil to the coil periphery. This gradient causes ferromagnetic particle structures with decreasing size to form along the path from the center of a wire coil to its periphery, which can offer a path for a vapor bubble to migrate away from a wire coil. Further, the working fluids described herein can comprise a surfactant to reduce the surface tension between vapor bubbles and the working fluid to further aid in the migration of vapor bubbles away from their point of formation.

The vapor chamber technologies described herein can have the further advantage of enabling vapor chambers that are thinner than existing vapor chamber designs with static evaporative resistance solutions, yet still have a high $Q_{max}$ (the maximum heat carrying capacity of a vapor chamber). Thinner vapor chambers may enable thinner computing system designs that have a more aesthetically pleasing industrial design.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the portion of a first layer or feature that is substantially perpendicular to a second layer or feature can include a first layer or feature that is +/−20 degrees from a second layer or feature, and a first surface that is substantially parallel to a second surface can include a first surface that is within several degrees of parallel from the second surface.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is physically adjacent to a layer Y refers to a layer that is in physical contact with layer Y.

As used herein, the term "integrated circuit component" refers to a packaged or unpackaged integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit, accelerator, chipset processor), I/O controller, memory, or network interface controller.

As used herein, the terms "operating", "executing", or "running" as they pertain to software or firmware in relation to a system, device, platform, or resource are used interchangeably and can refer to software or firmware stored in one or more computer-readable storage media accessible by the system, device, platform or resource, even though the software or firmware instructions are not actively being executed by the system, device, platform, or resource.

As used herein, the phrase "thermally coupled" refers to components that are coupled to facilitate the transfer of heat between them.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

Figures 2A, 2B, 3A, 3B:
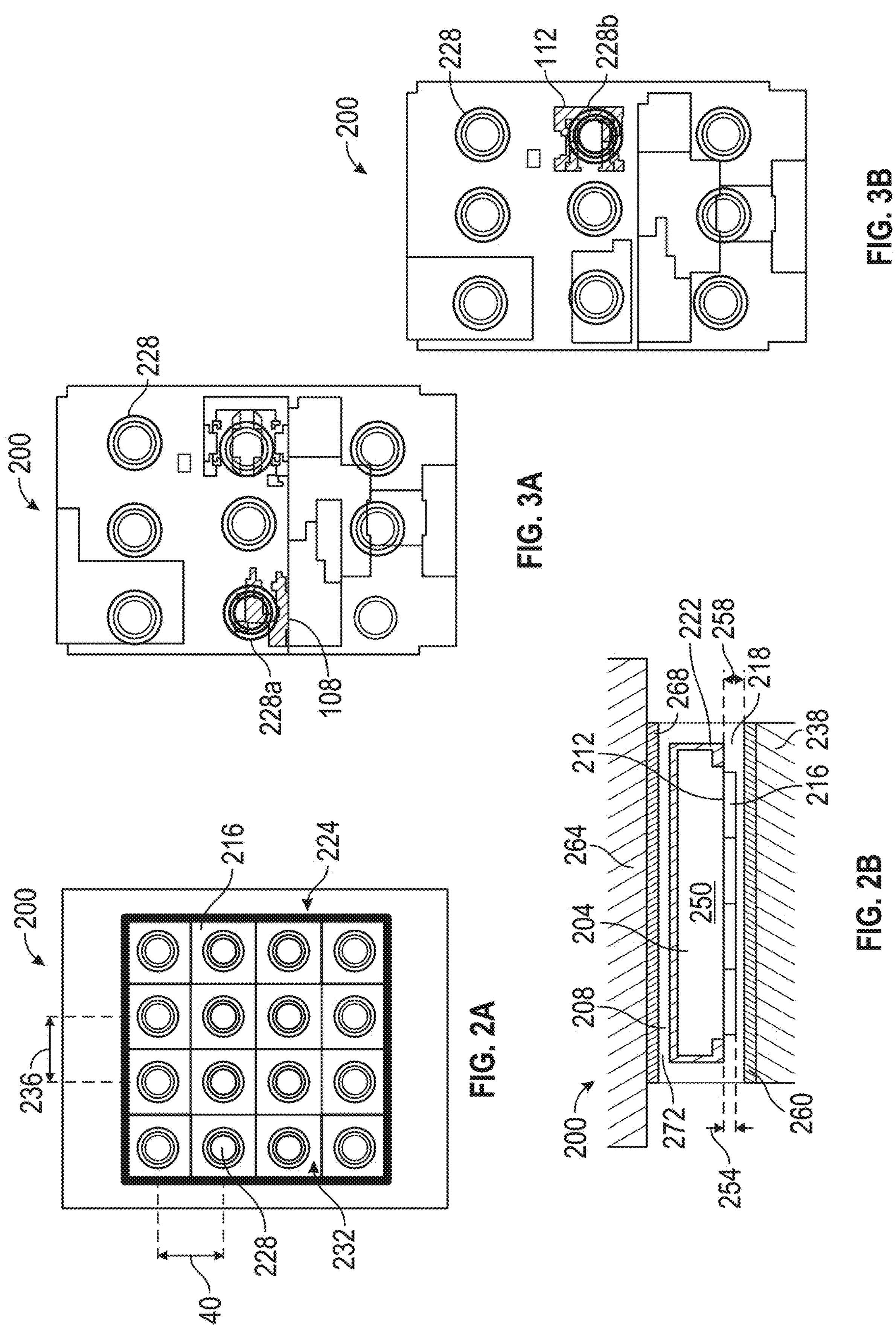
FIG. 2A illustrates a top view of an example vapor chamber with wire coils located on a bottom surface of an inner chamber of the vapor chamber.
FIG. 2B illustrates a cross-sectional view of the example vapor chamber of FIG. 2A taken along the line A-A'.
FIGS. 3A-3B illustrate example wire coil activations based on the type of workload executing on a heterogeneous die.

FIG. 2A illustrates a top view of an inner chamber of an example vapor chamber with wire coils located on a bottom surface of the inner chamber. FIG. 2B illustrates a cross-sectional view of the example vapor chamber of FIG. 2A. The vapor chamber 200 comprises a casing 208 that encloses an inner chamber 204. The inner chamber 204 comprises a first region (condenser region) 224 that comprises wicks 222 and a second region (evaporator region) 232 comprising a plurality of wire coils 228. The wicks 222 provide a path for the liquid form of the working fluid to return to the evaporator region 232. The evaporator region 232, which does not comprise wicks, comprises a plurality of recesses 216 formed on a bottom surface 212 of the inner chamber 204, one of the wire coils 228 located in one of the recesses 216.

The inner chamber 204 comprises a working fluid 250 comprising ferromagnetic particles (not shown). The working fluid 250 can be a two-phase working fluid, such as water, ammonia, methanol, refrigerants, ethanol, another working fluid described herein, or any other suitable working fluid. The ferromagnetic particles can be made of any ferromagnetic material that is also thermally conductive, such as iron, nickel, or cobalt.

In some embodiments, the ferromagnetic particles are nanoscale particles in that their overall dimensions are on the order of ones, tens, or hundreds of nanometers. In other embodiments, the ferromagnetic particles are microscale particles in that their dimensions are on the order of ones, tens, or hundreds of micrometers. Nanoscale ferromagnetic particles may be advantageous over microscale ferromagnetic particles in embodiments where a finer degree of control over the volumetric concentration of ferromagnetic particles in the vicinity of an activated wire coil is desired. For example, nanoscale ferromagnetic particles may enable the volumetric concentration of ferromagnetic particles to be controlled to within a single percentage point or a fraction of a percentage point. Microscale ferromagnetic particles may only enable control of the volumetric concentration of ferromagnetic particles to within several percentage points.

The working fluid 250 can further comprise a fluid modifier that reduces the surface tension between the gas phase of the working fluid, the liquid phase of the working fluid, and the ferromagnetic particles. The reduction of surface tension between these materials can improve pool-boiling heat transfer. In some embodiments, the fluid modifier can be sodium dodecyl, lauryl sulfate, or another anionic surfactant. The fluid modifier concentration of the working fluid can vary in the range of 0% (there is no fluid modifier in the working fluid) to 100% (the working fluid is comprised entirely of a fluid modifier). The working fluid of the vapor chambers described herein can comprise any of the following fluids or mixture of fluids: sodium dodecyl (SDS), lauryl sulfate (SLS), water and alcohol (the alcohol percentage can range from 10-80%), water and pentane, methanol, ethanol, water and propylene glycol (the propylene glycol percentage can range from 15%-80%), ammonia, ethane, acetone, pentane, refrigerant R-141b (dichlorofluoroethane), refrigerant R-134a, or another suitable fluid or fluid mixture.

The wire coils 228 are shown to be of uniform diameter and arranged in a 4×4 grid configuration, but in other embodiments, more or fewer wire coils 228 can be used, the wire coils 228 can be arranged in any manner (such as different regions of the vapor chamber having different wire coil densities), and the wire coils 228 can vary in diameter. In some embodiments, the arrangement of wire coils 228 is based on the arrangement of processor units in an integrated circuit component that the vapor chamber is designed to be attached to. In some embodiments, one or more wire coils are arranged to be located in the vicinity of a processor unit.

A wire coil can be considered to be within the vicinity of a processor unit if the boundary of the processor unit encloses the boundary of the wire coil (as defined by the outermost winding of the wire coil), if the boundary of the wire coil encloses the boundary of the processor unit, if the boundary of the wire coil overlaps the boundary of the processor unit, or if the boundaries of the wire coil and the processor unit are non-overlapping but within about 1 mm of each other. In some embodiments, one wire coil can be in the vicinity of a processor unit and the size (e.g., diameter) of the wire coil scales with the size of the processor unit. That is, bigger processor units have larger associated wire coils.

The recesses 216 in the bottom surface 212 can be formed by, for example, engraving or etching the bottom surface 212 of the inner chamber 204 or by another suitable process. In other embodiments, the wire coils 228 can be located in structures that are built up from the bottom surface 212 (by, for example, an additive manufacturing process) or fabricated separately from and attached to the bottom surface 212.

The wicks 222 located in the first region 224 can comprise sintered copper powder, copper fibers (which, in some embodiments, can be woven into forms such as a screen, mesh, or braids), or grooves integrated into a surface of the inner chamber 204. The wicks 222 can comprise other types of wicks, and in some embodiments, the wicks can be located in the evaporator and condenser regions 232 and 224. In a first example, a sintered copper powder can be spread over the evaporator and condenser regions 232 and 224. In a second example, the evaporator region 232 can comprise a pattern (e.g., a grid configuration) of wicks to provide for easy vapor bubble escape. In a third example, the evaporator region 232 can comprise a plurality of wedge-based patterns of microwicks in a wheel-shaped arrangement. In a fourth example, the evaporator region 232 can comprise an array of dual height hydrophilic micropillars in which taller micropillars are surrounded by one or more shorter micropillars. In a fifth example, the wick 222 can comprise multi-scaled mastoid process array wicks that can provide for the decoupling of condensate flow resistance and the capillary effect. The scales of the mastoid process array wicks can vary from nanometer to millimeter levels.

In a sixth example, the evaporator region 232 can comprise microwick pillars having geometric parameters (micropillar height, width, spacing, cross-sectional shape) optimized for a particular vapor chamber design. In a seventh example, the inner chamber 204 can comprise an array of microwick pillars with microwick pillar-free paths through the array having a leaf-vein-like architecture. This type of bionic arrangement of microwick pillars is meant to mimic fractal designs that occur in nature. In an eighth example, the evaporator region 232 comprises micro-grooved wicks with reentrant cavity array wicks. This wick structure comprises high aspect ratio microgrooves and micropores on wick side walls. In a ninth example, the wick structures in the evaporator region 232 comprise a two-layer evaporator wick comprising a liquid spreading layer and a cap layer with vapor vents, the liquid spreading layer and the cap layer linked through liquid feeding posts. In a tenth example, the wick structures comprise hybrid wicks with thin spreading layers and separate liquid feeding structures. In an eleventh example, the wick structures comprise hybrid wicks comprising a micropillar array and copper foam, which acts as a liquid supply layer. In some embodiments, the micropillars can have a nanostructure coating to give the micropillars a super hydrophilic effect.

Wire coils can be interspersed among the wicks located in the evaporator region 232 in the above examples. Other suitable wick structures or wick patterns that can reduce $R_{evap}$ or improve the dry-off heat flux or delay the dry-off of wicks in an evaporator region in which wire coils are located may be used in other embodiments.

The vapor chamber 200 further comprises a plurality of connectors (not shown in FIGS. 2A-2B) located on the exterior of the vapor chamber 200 and conductively coupled to the wire coils 228 that allow current to be supplied to the wire coils 228. In some embodiments, the connectors comprise connector pairs with one connector pair conductively coupled to one or more of the wire coils 228. In some embodiments, a wire coil 228 is connected to a connector or a connector pair by one or more wires. The connectors can be pads, pins (e.g., pogo pins), posts, or other suitable types of connectors that can connect to a suitable counterpart located on a printed circuit board or other computing device component. In some embodiments, the connectors allow for the vapor chamber 200 to be replaceable and/or serviceable.

In some embodiments, adjacent wire coils 228 in the grid configuration illustrated in FIG. 2A are spaced about 2-3 mm apart. In other embodiments, wire coils 228 arranged in a grid configuration can be spaced closer together or further apart and the spacing between rows of wire coils (e.g., spacing 240) and columns of wire coils (e.g., spacing 236) can be different. In some embodiments, the height of the wire coils (e.g., thickness 254) is about 0.1 mm and a thickness 258 of a bottom wall 218 of the vapor chamber 200 is about 0.25 mm. The wire coil thickness 254 and bottom wall thickness 258 can be different values in other embodiments.

The vapor chamber 200 can be thermally coupled to an integrated circuit component 238 by, for example, a first thermal interface material (TIM) layer 260 located between the bottom wall 218 and the integrated circuit component 238. The vapor chamber 200 can further be thermally coupled to a heat sink 264 by a second TIM layer 268 located between a top wall 272 of the vapor chamber and the heat sink 264. A TIM layer can be any suitable material, such as a silver thermal compound, thermal grease, phase change materials, indium foils or graphite sheets. The walls of the vapor chamber (casing 208) can be made of any suitable material, such as copper, aluminum, or stainless steel that is chemically compatible with vapor chamber operating liquids and is thermally conductive. The heat sink 264 can comprise a plurality of fins, pins or other thermally conductive structures capable of transporting heat from the vapor chamber 200 to the surrounding environment.

FIGS. 3A-3B illustrate example wire coil activations based on the type of workload executing on a heterogeneous die. FIGS. 3A and 3B illustrate example wire coil activations of the vapor chamber 200 of FIGS. 2A and 2B attached to an integrated circuit component comprising the heterogeneous die of FIGS. 1A-1C. FIG. 3A illustrates the activation of a wire coil 228*a* in response to the heterogeneous die executing a compute-intensive workload due to the vicinity of the wire coil 228*a* to the hotspot 108, reflecting the high utilization of the high performance core. None of the other wire coils 228 in FIG. 3A are activated as there are no other hotspots during execution of the compute-intensive workload. FIG. 3B illustrates the activation of a wire coil 228*b* in response to the heterogeneous die executing a workload that results in high utilization of low-power cores due to the vicinity of the wire coil 228*b* to the hotspot 112, reflecting the high utilization of the low-power cores. None of the other wire coils 228 in FIG. 3B are activated as there are no other hotspots during execution of the low-power workload. Thus, FIGS. 3A-3B illustrate the dynamic activation of wire coils 228 in the vapor chamber 200 based on the type of workload being executed by the heterogeneous die.

FIG. 4 is a graph showing example dependencies of working fluid thermal conductivity and vapor chamber evaporative resistance on ferromagnetic particle volumetric concentration. Curve 404 of graph 400 shows that the evaporative resistance ($R_{evap}$) of a vapor chamber decreases with increasing ferromagnetic particle volumetric fraction and curve 408 shows that the thermal conductivity of the working fluid ($k_{nf}$) increases with ferromagnetic particle volumetric fraction.

Graph 400 shows what level of $R_{evap}$ change may be expected for a given change in ferromagnetic particle volumetric concentration due to activation of a wire coil for a particular vapor chamber. For example, curve 404 indicates that increasing the ferromagnetic particle volumetric concentration in the vicinity of a wire coil from 60% (when the wire coil is not activated) to 80% (when the wire coil is activated) can reduce $R_{evap}$ by about 40%. The ferromagnetic particle volumetric concentration in the vicinity of a wire coil that is not activated, the ferromagnetic particle volumetric concentrations when the coil is and is not activated and the difference between the two can be tailored for a specific vapor chamber design by selecting a baseline (when no wire coils are activated) volumetric concentration of ferromagnetic particles and the amount of current caused to flow through a wire coil when activated. Graph 400 also shows that $R_{evap}$ can be incrementally reduced as the current through an activated coil (and thus the ferromagnetic particle volumetric concentration) is incrementally increased. Thus, in embodiments where a coil controller can cause a variable amount of current to flow through a wire coil, the evaporative resistance of the vapor chamber can change by a variable amount as well.

Figure 5A:
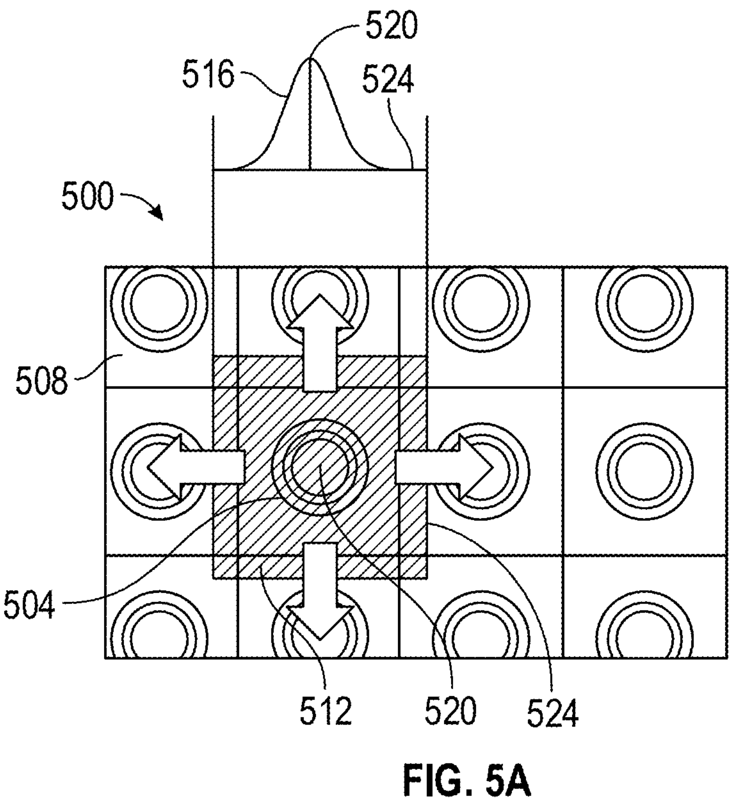
FIG. 5A illustrates an example magnetic flux gradient caused by an activated wire coil.

FIG. 5A illustrates an example magnetic flux gradient caused by an activated wire coil. An activated wire coil 504 located on a bottom surface 508 of an inner chamber of a vapor chamber 500 can cause a magnetic field to be created over a region 512. In some embodiments, the magnetic field strength generated by an activated wire coil can have a gradient from a center 520 of the activated wire coil 504 to a peripheral edge 524 of the region 512, as shown by profile 516. The profile 516 is only representative and a profile of the magnetic field strength across the vicinity of an activated wire coil can vary from the profile 516 in various embodiments. As the ferromagnetic particle volumetric concentration in the vicinity of an activated coil increases with increasing magnetic field strength, the magnetic field strength gradient from the center 520 of the activated wire coil 504 can cause a similar gradient in the ferromagnetic particle volumetric concentration. A ferromagnetic particle volumetric concentration gradient in the vicinity of an activated wire coil can create pathways for vapor bubbles created in the working fluid to escape a hotspot and thus aid in the prevention of dry-off in the hotspot region.

Figure 5B:
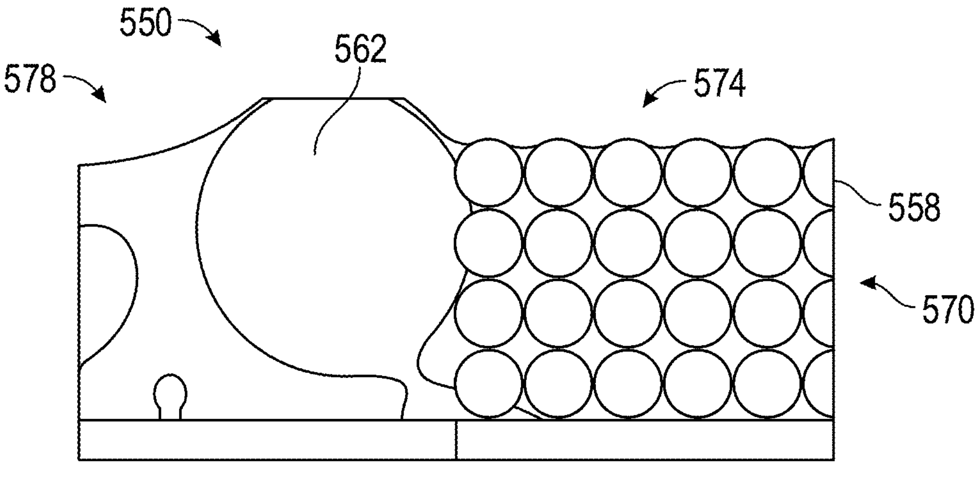
FIG. 5B illustrates an example cross-sectional view of a working fluid at the boundary at the edge of a region of an activated wire coil.

FIG. 5B illustrates an example cross-sectional view of an inner chamber of a vapor chamber at an edge of an activated wire coil region. Cross-sectional view 550 illustrates ferromagnetic particles 558 that have been attracted to an activated wire coil. The attracted ferromagnetic particles 558 can stack up in the vicinity of an activated wire coil to form a pillar structure 570. In addition to reducing $R_{evap}$ in the vicinity of the activated wire coil, the ferromagnetic particles 558 trigger nucleation boiling in the vicinity of the activated wire coil and cause vapor bubbles, such as vapor bubble 562, to form.

The cross-sectional view 550 shows an abrupt transition from the region 574 of high volumetric concentration of ferromagnetic particles to a region 578 comprising no ferromagnetic particles. As described above, in some embodiments there can be a more gradual gradient of the volumetric concentration of ferromagnetic particles (and thus a gradual coarsening of ferromagnetic particle structures) along a direction from the center of an activated wire coil toward the edge of the wire coil as the strength of the magnetic field generated by the activated coil decreases from the center of the wire coil toward the periphery of the wire coil.

Figures 6A, 6B, 6C:
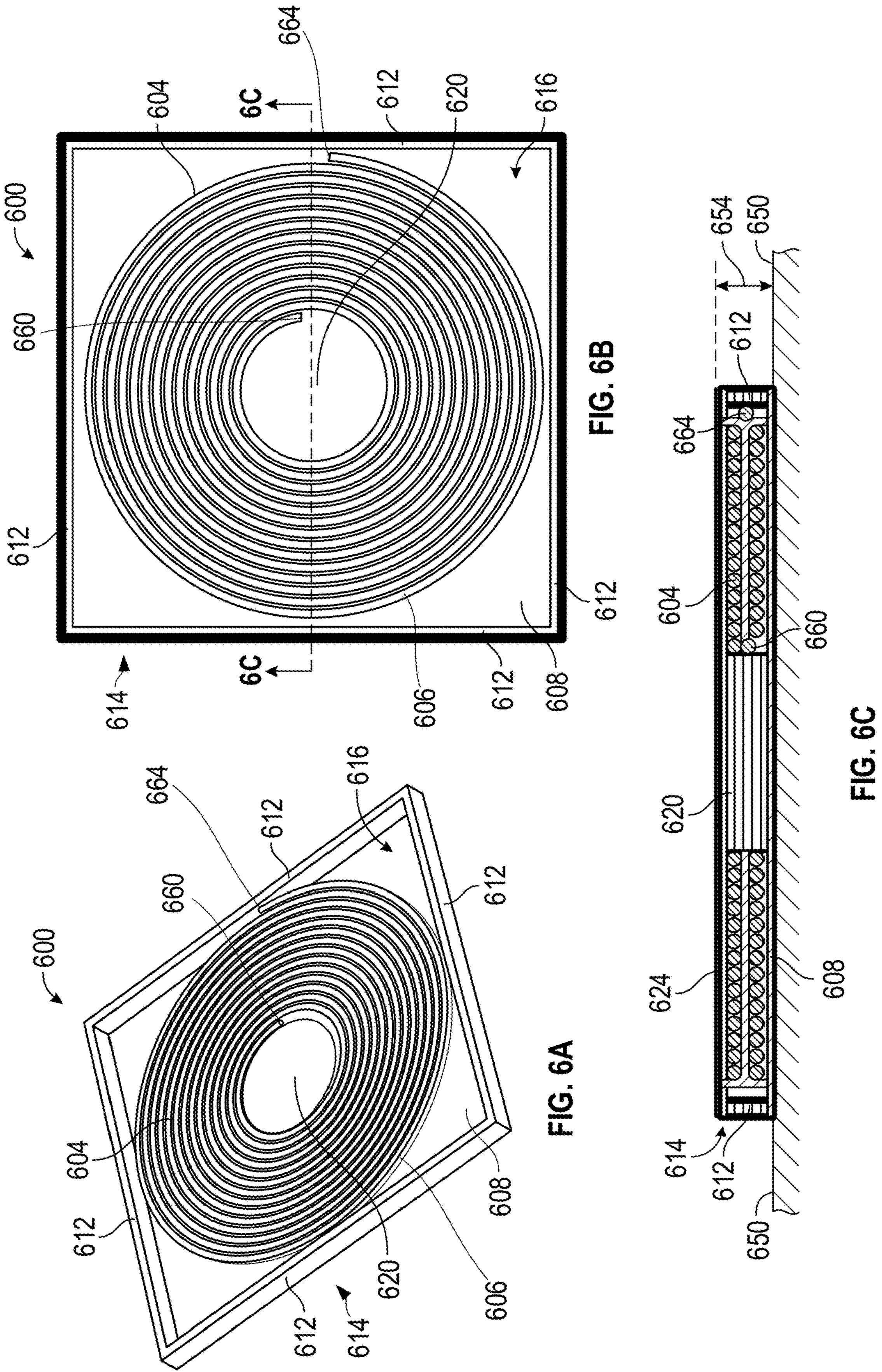
FIGS. 6A-6C illustrate an example wire coil design.

FIGS. 6A-6C illustrate an example wire coil design. FIGS. 6A, 6B, and 6C illustrate perspective, top, and cross-sectional views, respectively, of a wire coil 600. FIG. 6C illustrates a cross-sectional view of the wire coil 600 as indicated in FIG. 6B. The wire coil 600 comprises windings 604 wrapped around a ferrite core 620. The wire coil 600 is located in a recess 616 and is partially surrounded by a magnetic reflector 614 to aid in generating a more uniform magnetic field in the vicinity of the wire coil 600 when the wire coil 600 is activated. A first portion (bottom portion) 608 of the magnetic reflector 614 is positioned between the wire coil 600 and a bottom surface 650 of an inner chamber of a vapor chamber and second portions (side portions) 612 of the magnetic reflector 614 surround an outermost winding 606 of the wire coil. Although the recess 616 is shown as having a square shape, in other embodiments, the recess 616 can have other shapes, such as circular, hexagonal, octagonal, or another suitable shape.

The ferrite core 620 and the ferrite magnetic reflector 614 can comprise a ferrimagnetic compound comprising iron and oxygen, and one or more metallic elements, such as barium, strontium, manganese, zinc, nickel, and cobalt, or another suitable ferrite material. The windings 604 can comprise any type of wire. In some embodiments, the windings 604 comprise 42 AWG wires. In some embodiments, a combined thickness 654 of the wire coil 600, including the bottom portion 608 of the magnetic reflector 614 can be about 120 um.

In some embodiments, a magnetic layer 624 is located on top of the wire coil 600 to attract ferromagnetic particles in the vicinity of the wire coil 600 when the wire coil is not activated. In some embodiments, the magnetic layer 624 can be thin and can have a thickness of, for example, 10-20 um.

Ends 660 and 664 of the wire coil are conductively coupled to connectors located on the exterior of the vapor chamber to allow for connections to a coil controller that causes current to flow through the wire coil 600.

Figure 7:
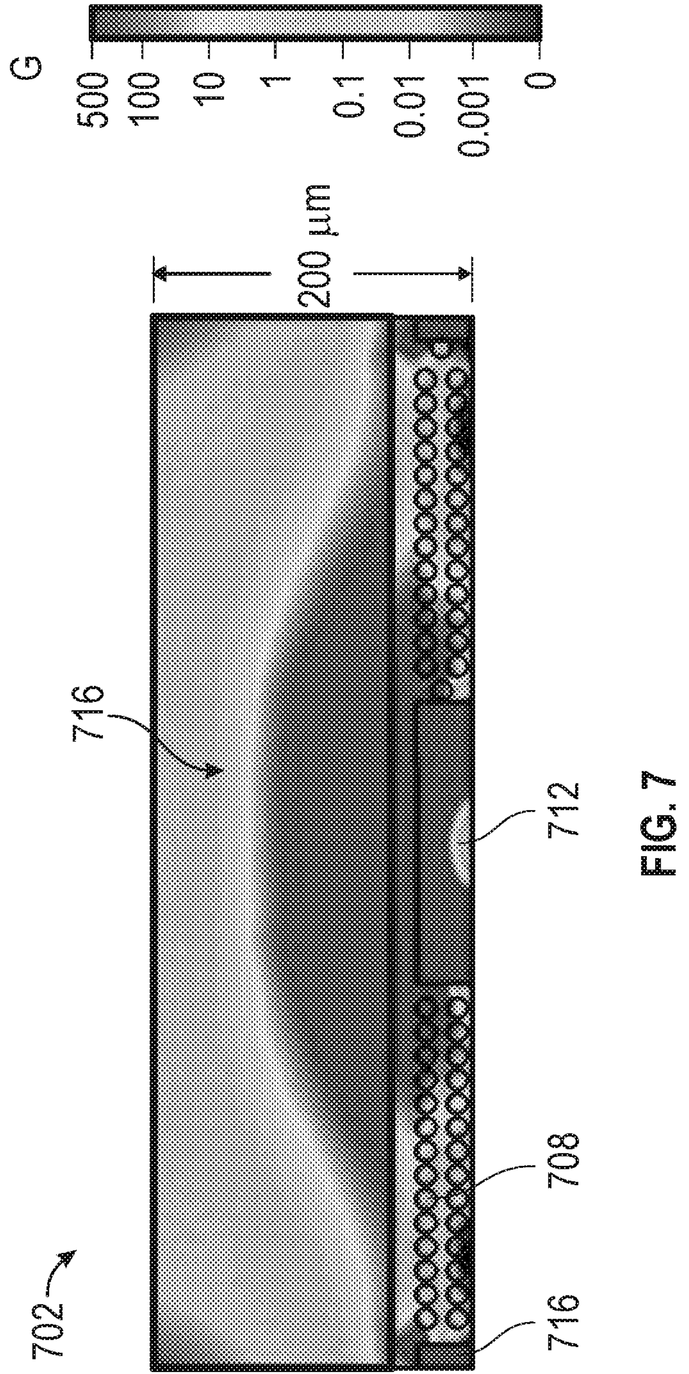
FIG. 7 is an example magnetic flux distribution generated by an activated wire coil.

FIG. 7 is an example magnetic flux distribution generated by an activated wire coil. The distribution shows a simulated generated magnetic flux distribution for a wire coil 702 comprising a center 712, edge and bottom ferrite reflectors 716, and wire coil windings 708. In some embodiments, the magnetic flux strength that needs to be generated to attract ferromagnetic particles in the vicinity of an activated wire coil is about 450 G. The amount of current needed to create a magnetic field strength strong enough in the vicinity of an activated wire coil to attract ferromagnetic particles can be referred to as a current threshold. The magnetic flux distribution indicates that activating the wire coil at a power consumption level of about 0.5 W generates about 450 G of magnetic flux at a distance of 200 μm from the wire coil. The magnetic field is concentrated around the wire coil and weakens rapidly away from the wire coil. That is, there is a magnetic field strength gradient similar to that illustrated by magnetic field strength profile 516 in FIG. 5A. In another embodiment, a wire coil with a thickness of 80 μm and consuming about 570 mW of power when activated can generate a similar magnetic field strength profile as illustrated in FIG. 7.

Figure 8:
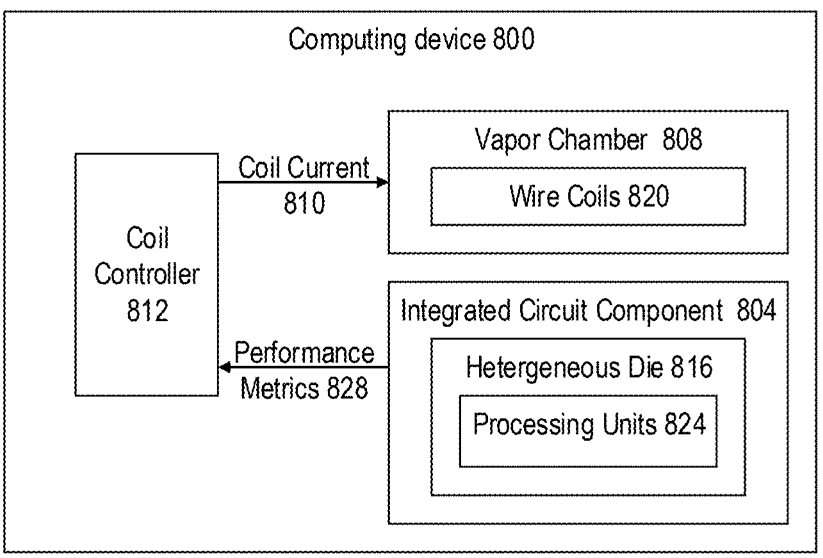
FIG. 8 is a block diagram of an example computing device comprising a vapor chamber with a working fluid comprising ferromagnetic particles and wire coils.

FIG. 8 is a block diagram of an example computing device comprising a vapor chamber with wire coils and a working fluid comprising ferromagnetic particles. The computing device 800 comprises an integrated circuit component 804, a vapor chamber 808, and a coil controller 812. The integrated circuit component 804 comprises a heterogeneous die 816, which comprises a plurality of processor units 824 of at least two different processor unit types. The integrated circuit component 804 is cooled by the vapor chamber 808, which comprises a working fluid having ferromagnetic particles and a plurality of wire coils 820 to adjust the local evaporative resistance in the vapor chamber. The coil controller 812 causes current to flow through the wire coils based on performance metrics 828 indicating the performance level (e.g., power consumption level) of the processor units 824. The performance metrics 828 are provided by the integrated circuit component 804 to the coil controller.

The coil controller 812 can be firmware, software, hardware, or a combination thereof. For example, the coil controller 812 can be part of an operating system executing on the computing device 800. In another example, the coil controller 812 can be part of an Intel® Dynamic Tuning Technology (DTT) driver that is installed on the computing device 800. In yet another embodiment, the coil controller 812 can be part of a platform-level component that manages hardware resources (e.g., integrated circuit component 804, vapor chamber 808) of the computing device 800. The coil controller 812 causes current 810 to flow through the wire coils 820 of the vapor chamber 808 based on the performance metrics 828. If the performance metrics 828 indicate one of the processor units 824 is operating at a high power consumption level (e.g., a power consumption level above a threshold), the coil controller 812 causes current to flow through the wire coil to reduce $R_{evap}$ in the vicinity of the processor unit consuming a high amount of power to increase the ability of the working fluid to remove heat from the processor unit. The coil controller 812 causes a current greater than a current threshold to flow through the wire coil to attract ferromagnetic particles in the vicinity of an activated coil. The coil controller 812 can have access to a database or data structure that stores information indicating which performance metrics 828 and wire coils 820 are associated with which processor units 824 and causes current to flow through one or more wire coils 820 based on the performance metrics 828 based on the performance metric to wire coil mapping.

The coil controller 812 can cause different amounts of current to flow through different wire coils. Further, the coil controller 812 can cause different levels of current to flow through a wire coil 820 to cause different levels of ferromagnetic particle volumetric concentration increases in the vicinity of a wire coil. For example, the coil controller 812 can cause a first level of current to flow through a wire coil 820 if the processor unit associated with the wire coil 820 is operating at a maximum steady-state power consumption level (e.g., a PL1 power level in some Intel® processors) and a second level of current to flow through the wire coil 820 if the processor unit associated with the wire coil 820 is operating at a maximum transient power consumption level (e.g., a PL2 power level), which is typically greater than the maximum steady-state power consumption level.

The coil controller 812 can dynamically adjust the amount of current flowing through a wire coil. For example, after receiving a first set of performance metrics indicating a first level of power consumption of a first processor unit and causing a first amount of current to flow through a first wire coil associated with the first processor unit, the coil controller 812 can receive additional performance metrics indicating a second power consumption level of the first processor unit (that is different than the first power consumption level) and cause a second amount of current (that is different than the first amount of current) to flow through the first wire coil. If the additional performance metrics indicate that the first processor unit is operating at a power consumption level below a power consumption threshold level, the coil controller 812 can cease the flow of current to the first wire coil.

The performance metrics 828 can be any information indicating a performance level (such as information indicating a power consumption level) of the integrated circuit component 804 or one or more of the processor units 824. The performance metrics 828 can comprise, for example, an operating voltage, an operating frequency, and/or an operating temperature of the integrated circuit component 804 or one or more of the processor units 824. The performance metrics 828 can be provided to the coil controller 812 by the integrated circuit component 804, as shown in FIG. 8 or by another component, such as an operating system daemon.

The performance metrics 828 can be made available from various sources. For example, performance metrics 828 can be made available by one or more performance counters or monitors, such as an Intel® Performance Monitor Unit (PMU). The performance counters or monitors can provide performance metrics at the processor unit 824 or integrated circuit component 804 level.

In some embodiments, the performance metrics 828 can comprise one or more of the following: information indicating an integrated circuit component or processor unit power consumption, information indicating a reference operating frequency of an integrated circuit component, and information indicating an operating frequency of a processor unit within an integrated circuit component.

In some embodiments, performance metrics can be provided by plugins to an operating system daemon, such as the Linux collectd daemon turbostat plugin, which can provide information about an integrated circuit component topology, frequency, idle power-state statistics, temperature, power usage, etc.

Performance metrics can be provided to the coil controller 812 at periodic (e.g., 1 second, 10 seconds) or other intervals and the coil controller 812 can adjust the current supplied to various wire coils at periodic (e.g., 1 second, 10 seconds) or other intervals as well. In some embodiments, the performance metrics 828 are pushed to the coil controller 812 by the integrated circuit component 804 or another component and in other embodiments the coil controller 812 polls the integrated circuit component 804 or other components for the performance metrics 828.

Figure 9:
FIG. 9 is an example method for adjusting the local evaporative resistance of a vapor chamber.

FIG. 9 is an example method for adjusting the local evaporative resistance of a vapor chamber. The method 900 can be performed by, for example, a computing system comprising any of the vapor chambers described herein. At 910, one or more performance metrics are received indicating a performance level of one or more processor units located in an integrated circuit component, the integrated circuit component attached to a vapor chamber comprising: a casing defining an inner chamber, the inner chamber comprising: a working fluid comprising ferromagnetic particles; an inner surface; and a plurality of wire coils located on the inner surface. At 920, a current greater than a current threshold is caused to flow through the one or more of the wire coils based on the performance metrics.

In some embodiments, the method 900 can comprise additional elements. For example, causing current to flow through the one or more wire coils can comprise: causing a first amount of current to flow through a first wire coil when first performance metrics of the performance metrics indicate that a first processor unit of the processor units is operating at a first power consumption level; and causing a second amount of current to flow through a second wire coil when one or more second performance metrics of the performance metrics indicate a second processor unit of the processor units is operating at a second performance level, the first performance level being different than the second performance level, the first amount of current being different than the second amount of current.

The vapor chambers described herein can be used with any processor unit, integrated circuit component, or located in any computing system described or referenced herein. An integrated circuit component attached to a vapor chamber as described herein can be attached to a printed circuit board. In some embodiments, one or more additional integrated circuit components can be attached to the circuit board. In some embodiments, the printed circuit board and the integrated circuit component can be located in a computing device that comprises a housing that encloses the printed circuit board and the integrated circuit component.

Figure 10:
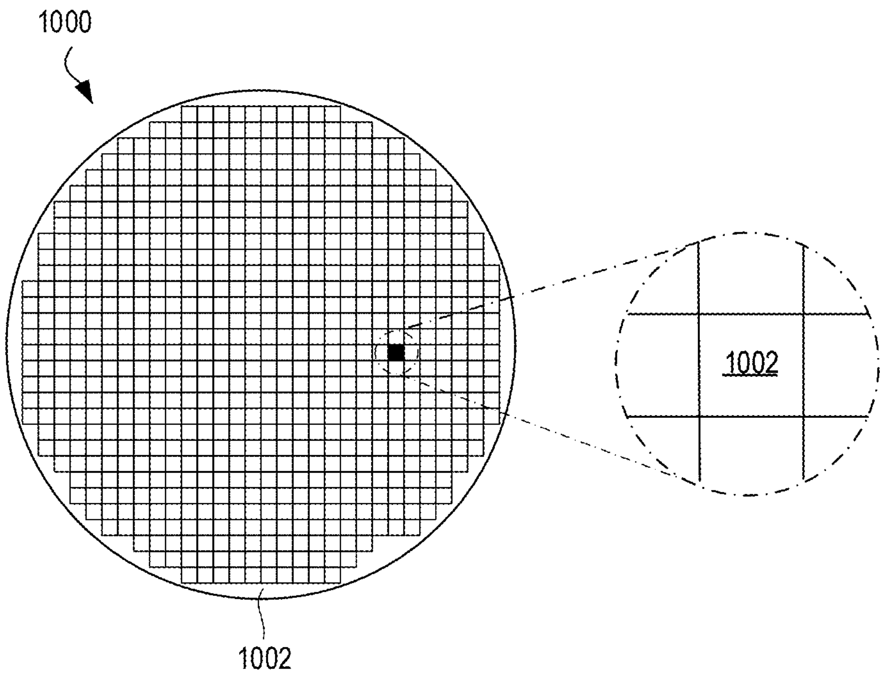
FIG. 10 is a top view of a wafer and dies that may be included in a microelectronic assembly, in accordance with any of the embodiments disclosed herein.

FIG. 10 is a top view of a wafer 1000 and dies 1002 that may be included in any of the integrated circuit components or heterogeneous dies disclosed herein. The wafer 1000 may be composed of semiconductor material and may include one or more dies 1002 having integrated circuit structures formed on a surface of the wafer 1000. The individual dies 1002 may be a repeating unit of an integrated circuit product that includes any suitable integrated circuit. After the fabrication of the semiconductor product is complete, the wafer 1000 may undergo a singulation process in which the dies 1002 are separated from one another to provide discrete "chips" of the integrated circuit product. The die 1002 may be any of the heterogeneous dies described herein. The die 1002 may include one or more transistors (e.g., some of the transistors 1140 of FIG. 11, discussed below), supporting circuitry to route electrical signals to the transistors, passive components (e.g., signal traces, resistors, capacitors, or inductors), and/or any other integrated circuit components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processor unit (e.g., the processor unit 1302 of FIG. 13) or other logic that is configured to store information in the memory devices or execute instructions stored in the memory array. Various ones of the microelectronic assemblies disclosed herein may be manufactured using a die-to-wafer assembly technique in which some dies 1002 are attached to a wafer 1000 that include others of the dies 1002, and the wafer 1000 is subsequently singulated.

Figure 11:
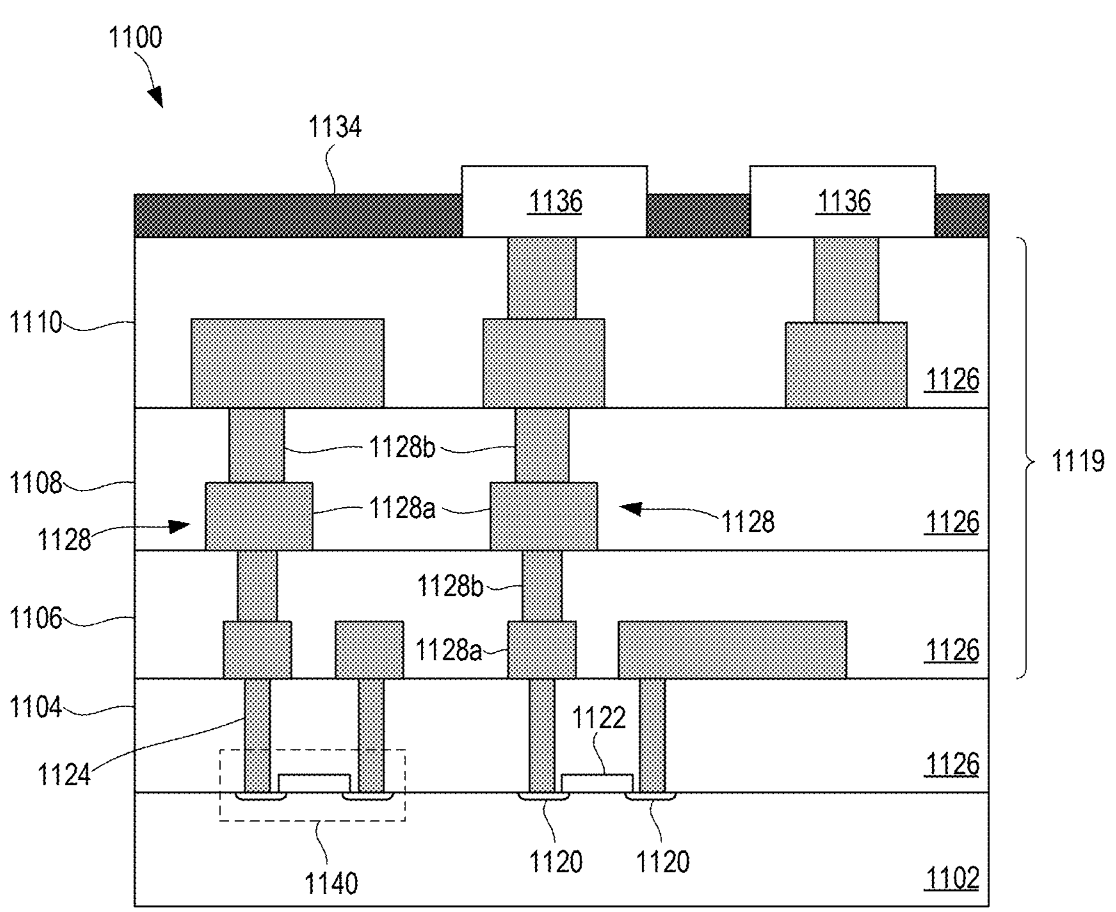
FIG. 11 is a cross-sectional side view of an integrated circuit device that may be included in a microelectronic assembly, in accordance with any of the embodiments disclosed herein.

FIG. 11 is a cross-sectional side view of an integrated circuit device 1100 that may be included in any of the integrated circuit components attached to any of the vapor chambers disclosed herein. One or more of the integrated circuit devices 1100 may be included in one or more dies 1002 (FIG. 10). The integrated circuit device 1100 may be formed on a die substrate 1102 (e.g., the wafer 1000 of FIG. 10) and may be included in a die (e.g., the die 1002 of FIG. 10). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some embodiments, the die substrate 1102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an integrated circuit device 1100 may be used. The die substrate 1102 may be part of a singulated die (e.g., the dies 1002 of FIG. 10) or a wafer (e.g., the wafer 1000 of FIG. 10).

The integrated circuit device 1100 may include one or more device layers 1104 disposed on the die substrate 1102. The device layer 1104 may include features of one or more transistors 1140 (e.g., metal oxide semiconductor field-effect transistors (MOSFETs)) formed on the die substrate 1102. The transistors 1140 may include, for example, one or more source and/or drain (S/D) regions 1120, a gate 1122 to control current flow between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the die substrate 1102 and two sidewall portions that are substantially perpendicular to the top surface of the die substrate 1102. In other embodiments, at least one of the metal layers that form the gate electrode may simply be a planar layer that is substantially parallel to the top surface of the die substrate 1102 and does not include sidewall portions substantially perpendicular to the top surface of the die substrate 1102. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of individual transistors 1140. The S/D regions 1120 may be formed using an implantation/diffusion process or an etching/deposition process, for example. In the former process, dopants such as boron, aluminum, antimony, phosphorus, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorus. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the integrated circuit device 1100.

The interconnect structures 1128 may be arranged within the interconnect layers 1106-1110 to route electrical signals according to a wide variety of designs; in particular, the arrangement is not limited to the particular configuration of interconnect structures 1128 depicted in FIG. 11. Although a particular number of interconnect layers 1106-1110 is depicted in FIG. 11, embodiments of the present disclosure include integrated circuit devices having more or fewer interconnect layers than depicted.

In some embodiments, the interconnect structures 1128 may include lines 1128*a* and/or vias 1128*b* filled with an electrically conductive material such as a metal. The lines 1128*a* may be arranged to route electrical signals in a direction of a plane that is substantially parallel with a surface of the die substrate 1102 upon which the device layer 1104 is formed. For example, the lines 1128*a* may route electrical signals in a direction in and out of the page and/or in a direction across the page from the perspective of FIG. 11. The vias 1128*b* may be arranged to route electrical signals in a direction of a plane that is substantially perpendicular to the surface of the die substrate 1102 upon which the device layer 1104 is formed. In some embodiments, the vias 1128*b* may electrically couple lines 1128*a* of different interconnect layers 1106-1110 together.

The interconnect layers 1106-1110 may include a dielectric material 1126 disposed between the interconnect structures 1128, as shown in FIG. 11. In some embodiments, dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. The device layer 1104 may include a dielectric material 1126 disposed between the transistors 1140 and a bottom layer of the metallization stack as well. The dielectric material 1126 included in the device layer 1104 may have a different composition than the dielectric material 1126 included in the interconnect layers 1106-1110; in other embodiments, the composition of the dielectric material 1126 in the device layer 1104 may be the same as a dielectric material 1126 included in any one of the interconnect layers 1106-1110.

A first interconnect layer 1106 (referred to as Metal 1 or "M1") may be formed directly on the device layer 1104. In some embodiments, the first interconnect layer 1106 may include lines 1128*a* and/or vias 1128*b*, as shown. The lines 1128*a* of the first interconnect layer 1106 may be coupled with contacts (e.g., the S/D contacts 1124) of the device layer 1104. The vias 1128*b* of the first interconnect layer 1106 may be coupled with the lines 1128*a* of a second interconnect layer 1108.

The second interconnect layer 1108 (referred to as Metal 2 or "M2") may be formed directly on the first interconnect layer 1106. In some embodiments, the second interconnect layer 1108 may include vias 1128*b* to couple the lines 1128 of the second interconnect layer 1108 with the lines 1128*a* of a third interconnect layer 1110. Although the lines 1128*a* and the vias 1128*b* are structurally delineated with a line within individual interconnect layers for the sake of clarity, the lines 1128*a* and the vias 1128*b* may be structurally and/or materially contiguous (e.g., simultaneously filled during a dual-damascene process) in some embodiments.

The third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the integrated circuit device 1100 (i.e., farther away from the device layer 1104) may be thicker than the interconnect layers that are lower in the metallization stack 1119, with lines 1128*a* and vias 1128*b* in the higher interconnect layers being thicker than those in the lower interconnect layers.

The integrated circuit device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to external devices. For example, solder bonds may be formed on the one or more conductive contacts 1136 to mechanically and/or electrically couple an integrated circuit die including the integrated circuit device 1100 with another component (e.g., a printed circuit board). The integrated circuit device 1100 may include additional or alternate structures to route the electrical signals from the interconnect layers 1106-1110; for example, the conductive contacts 1136 may include other analogous features (e.g., posts) that route the electrical signals to external components.

In some embodiments in which the integrated circuit device 1100 is a double-sided die, the integrated circuit device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the integrated circuit device 1100 from the conductive contacts 1136.

In other embodiments in which the integrated circuit device 1100 is a double-sided die, the integrated circuit device 1100 may include one or more through silicon vias (TSVs) through the die substrate 1102; these TSVs may make contact with the device layer(s) 1104, and may provide conductive pathways between the device layer(s) 1104 and additional conductive contacts (not shown) on the opposite side of the integrated circuit device 1100 from the conductive contacts 1136. In some embodiments, TSVs extending through the substrate can be used for routing power and ground signals from conductive contacts on the opposite side of the integrated circuit device 1100 from the conductive contacts 1136 to the transistors 1140 and any other components integrated into the die 1100, and the metallization stack 1119 can be used to route I/O signals from the conductive contacts 1136 to transistors 1140 and any other components integrated into the die 1100.

Multiple integrated circuit devices 1100 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 12:
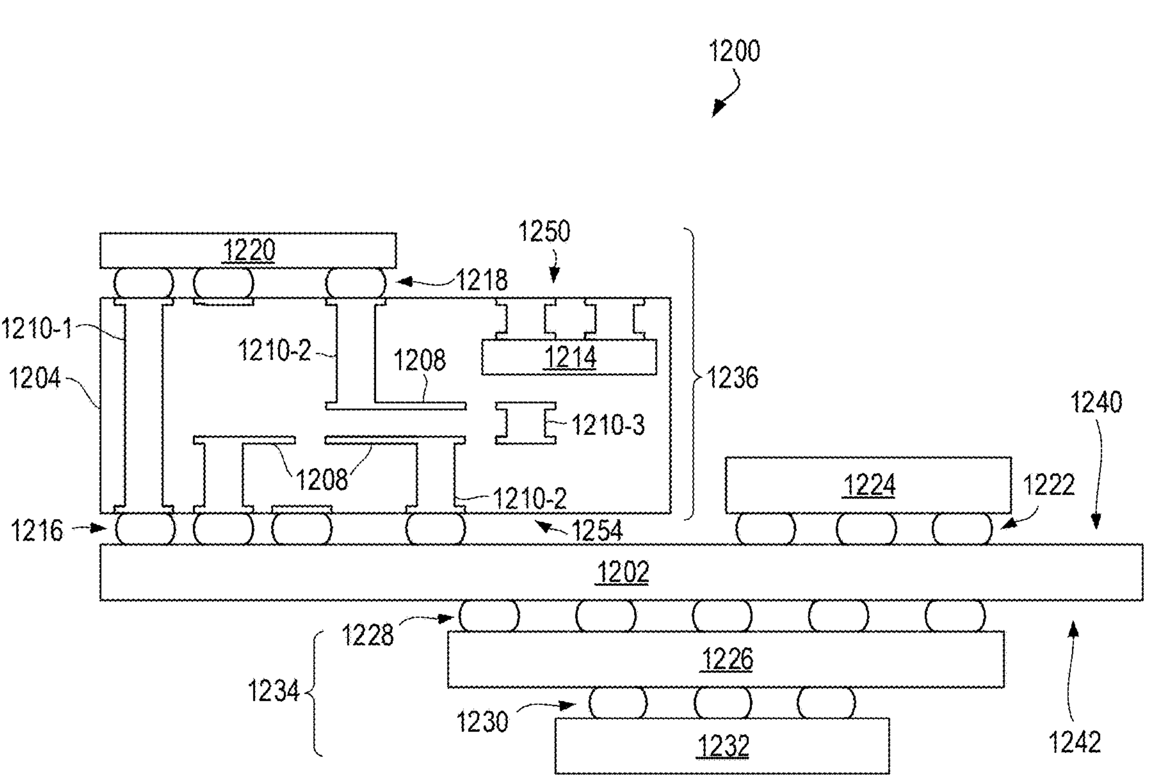
FIG. 12 is a cross-sectional side view of an integrated circuit device assembly that may include a microelectronic assembly, in accordance with any of the embodiments disclosed herein.

FIG. 12 is a cross-sectional side view of an integrated circuit device assembly 1200 that may include any of the microelectronic assemblies disclosed herein. In some embodiments, the integrated circuit device assembly 1200 may comprise any of the vapor chambers described herein. The integrated circuit device assembly 1200 includes a number of components disposed on a circuit board 1202 (which may be a motherboard, system board, mainboard, etc.). The integrated circuit device assembly 1200 includes components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The integrated circuit device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpackaged integrated circuit product that includes one or more integrated circuit dies (e.g., the die 1002 of FIG. 10, the integrated circuit device 1100 of FIG. 11) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1220, a single monolithic integrated circuit die comprises solder bumps attached to contacts on the die. The solder bumps allow the die to be directly attached to the interposer 1204. The integrated circuit component 1220 can comprise one or more computing system components, such as one or more processor units (e.g., system-on-a-chip (SoC), processor core, graphics processing unit (GPU), accelerator, chipset processor), I/O controller, memory, or network interface controller. In some embodiments, the integrated circuit component 1220 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1220 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204.

In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The integrated circuit device assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit device assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
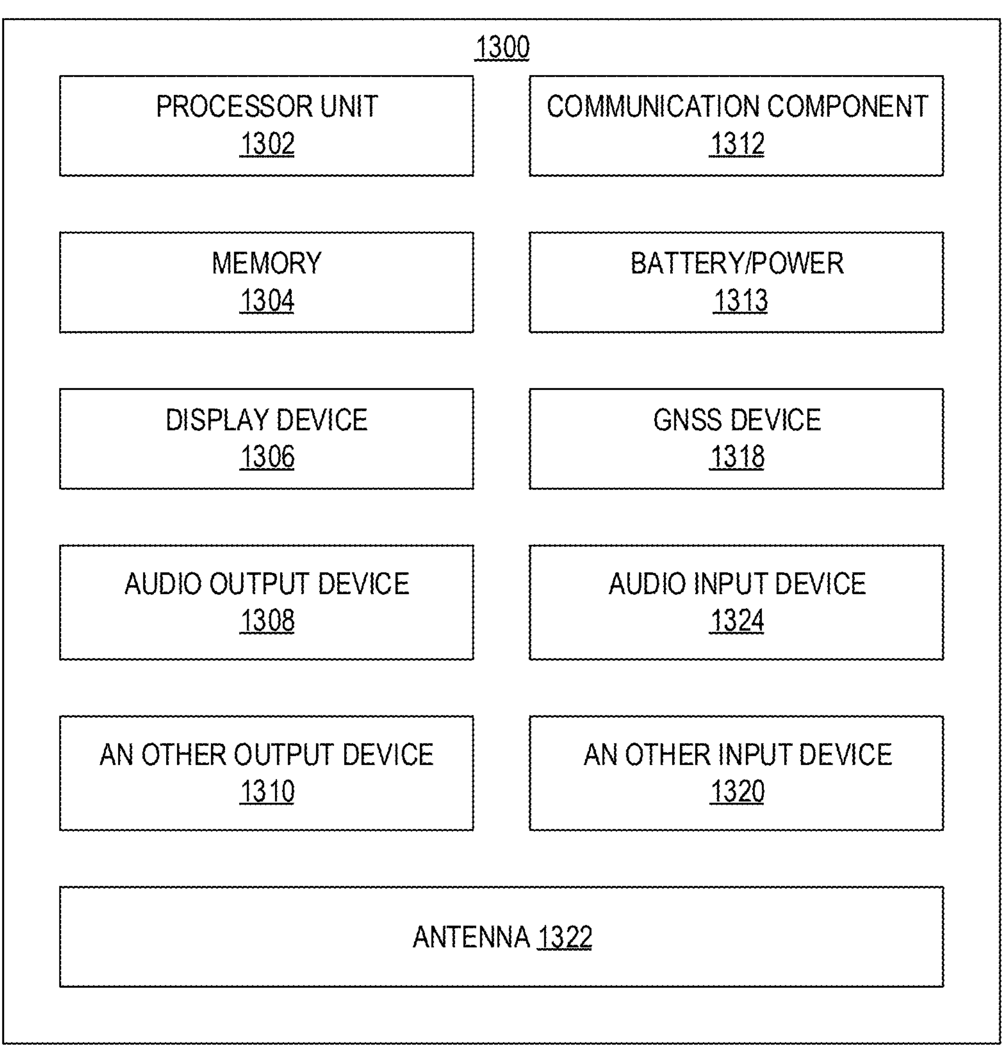
FIG. 13 is a block diagram of an example electrical device that may include a microelectronic assembly, in accordance with any of the embodiments disclosed herein.

FIG. 13 is a block diagram of an example electrical device 1300 that may include one or more of the vapor chambers disclosed herein. For example, any suitable ones of the components of the electrical device 1300 may include one or more of the integrated circuit device assemblies 1200, integrated circuit components 1220, integrated circuit devices 1100, or integrated circuit dies 1002 disclosed herein. A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards, mainboards, or system boards. In some embodiments, one or more of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-volatile memories), solid-state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1300 can comprise one or more processor units 1302 that are heterogeneous or asymmetric to another processor unit 1302 in the electrical device 1300. There can be a variety of differences between the processing units 1302 in a system in terms of a spectrum of metrics of merit including architectural, microarchitectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1313. The battery/power circuitry 1313 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such as speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as microphones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include another output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include another input device 1320 (or corresponding interface circuitry, as discussed above). Examples of the other input device 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data. In some embodiments, the electrical device 1300 may comprise multiple discrete physical components. Given the range of devices that the electrical device 1300 can be manifested as in various embodiments, in some embodiments, the electrical device 1300 can be referred to as a computing device or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, a list of items stated or recited as having a trait, feature, etc. preceded by the word "individual" or "respective" means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises a sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 comprises the apparatus comprising: a casing defining an inner chamber, the inner chamber comprising: a working fluid comprising ferromagnetic particles; an inner surface; a plurality of wire coils located on the inner surface; and one or more connectors, individual of the connectors conductively coupled to at least one of the wire coils.

Example 2 comprises the apparatus of example 1, wherein individual of the connectors are conductively coupled to the at least one of the wire coils by one or more wires.

Example 3 comprises the apparatus of example 1 or 2, wherein a volumetric concentration of the ferromagnetic particles in the working fluid is a first value in a vicinity of a first wire coil when no current flows through the first wire coil and the volumetric concentration of the ferromagnetic particles in the working fluid is a second value in the vicinity of the first wire coil when an amount of current greater than a current threshold is caused to flow through the first wire coil, the second value greater than the first value.

Example 4 comprises the apparatus of any of examples 1-3, wherein a volumetric concentration of the ferromagnetic particles in the working fluid is a first value above a center of a first wire coil and a second value above an outermost winding of the first wire coil when an amount of current greater than a current threshold is caused to flow through the first wire coil.

Example 5 comprises the apparatus of any one of examples 1-4, wherein the ferromagnetic particles are nanoscale ferromagnetic particles.

Example 6 comprises the apparatus of any one of examples 1-5, wherein the ferromagnetic particles comprise one or more of iron, nickel, and cobalt.

Example 7 comprises the apparatus of any one of examples 1-6, wherein the inner surface further comprises: a first region; and a second region surrounding the first region, the second region comprising one or more wicks.

Example 8 comprises the apparatus of any one of examples 1-7, the inner surface comprising a plurality of recesses, individual of the wire coils located in one of the recesses.

Example 9 comprises the apparatus of any one of examples 1-8, wherein the wire coils are arranged in a grid configuration.

Example 10 comprises the apparatus of any one of examples 1-9, wherein the plurality of wire coils comprises a first wire coil having a first diameter and a second wire coil having a second diameter different than the first diameter.

Example 11 comprises the apparatus of any one of examples 1-10, wherein an arrangement of one or more of the wire coils is based on an arrangement of one or more processor units of an integrated circuit component to which the apparatus is to be attached.

Example 12 comprises the apparatus of any one of examples 1-11, wherein one of the wire coils comprises a ferrite core.

Example 13 comprises the apparatus of any one of examples 1-12, wherein at least a portion of one of the wire coils is surrounded by a magnetic reflector.

Example 14 comprises the apparatus of example 13, wherein a first portion of the magnetic reflector is positioned between the one of the wire coils and the inner surface and a second portion of the magnetic reflector surrounds an outermost winding of the one of the wire coils.

Example 15 comprises the apparatus of any one of examples 1-14, wherein a layer comprising a magnetic material is located on top of one of the wire coils.

Example 16 comprises the apparatus of any one of examples 1-15, wherein the working fluid comprises sodium dodecyl.

Example 17 comprises the apparatus of any one of examples 1-16, wherein the working fluid comprises lauryl sulfate.

Example 18 is an apparatus comprising: a vapor chamber comprising an inner chamber, the inner chamber comprising: a working fluid comprising ferromagnetic particles; an inner surface; and a plurality of wire coils located on the inner surface; one or more connectors, individual of the connectors conductively coupled to at least one of the wire coils; an integrated circuit component thermally coupled to the vapor chamber, the integrated circuit component comprising a plurality of processor units; and a coil controller to cause current to flow through one or more of the wire coils via the connectors based on one or more performance metrics indicating a performance level of one or more of the processor units.

Example 19 comprises the apparatus of example 18, wherein individual of the connectors are conductively coupled to the one or more of the wire coils by one or more wires.

Example 20 comprises the apparatus of example 18 or 19, wherein a volumetric concentration of the ferromagnetic particles in the working fluid is a first value in a vicinity of a first wire coil when no current flows through the first wire coil and the volumetric concentration of the ferromagnetic particles in the working fluid is a second value in the vicinity of the first wire coil when an amount of current greater than a current threshold is caused to flow through the first wire coil, the second value greater than the first value.

Example 21 comprises the apparatus of any one of examples 18-20, wherein a volumetric concentration of the ferromagnetic particles in the working fluid is a first value above a center of a first wire coil and a second value above an outermost winding of the first wire coil when an amount of current greater than a current threshold is caused to flow through the first wire coil.

Example 22 comprises the apparatus of any one of examples 18-21, wherein the ferromagnetic particles are nanoscale ferromagnetic particles.

Example 23 comprises the apparatus of any one of examples 18-22, wherein the ferromagnetic particles comprise one or more of iron, nickel, and cobalt.

Example 24 comprises the apparatus of any one of examples 18-23, wherein the inner surface further comprises: a first region; and a second region surrounding the first region, the second region comprising one or more wicks.

Example 25 comprises the apparatus of any one of examples 18-24, the inner surface comprising a plurality of recesses, individual of the wire coils located in one of the recesses.

Example 26 comprises the apparatus of any one of examples 18-25, wherein the wire coils are arranged in a grid configuration.

Example 27 comprises the apparatus of any one of examples 18-26, wherein the plurality of wire coils comprises a first wire coil having a first diameter and a second wire coil having a second diameter different than the first diameter.

Example 28 comprises the apparatus of any one of examples 18-27, wherein an arrangement of one or more of the wire coils is based on an arrangement of the plurality of processor units of an integrated circuit component.

Example 29 comprises the apparatus of any one of examples 18-28, wherein one of the wire coils comprises a ferrite core.

Example 30 comprises the apparatus of any one of examples 18-29, wherein at least a portion of one of the wire coils is surrounded by a magnetic reflector.

Example 31 comprises the apparatus of any one of examples 18-30, wherein a first portion of the magnetic reflector is positioned between the one of the wire coils and the inner surface and a second portion of the magnetic reflector surrounds an outermost winding of the one of the wire coils.

Example 32 comprises the apparatus of example 31, wherein a layer comprising a magnetic material is located on top of one of the wire coils.

Example 33 comprises the apparatus of any one of examples 18-32, wherein the working fluid comprises sodium dodecyl.

Example 34 comprises the apparatus of any one of examples 18-32, wherein the working fluid comprises lauryl sulfate.

Example 35 comprises the apparatus of any one of examples 18-34, wherein the plurality of the processor units comprises at least one processor unit of a first processor unit type and at least one processor unit of a second processor unit type.

Example 36 comprises the apparatus of any one of examples 1-35, wherein the integrated circuit component is further attached to a printed circuit board.

Example 37 comprises the apparatus of example 36, wherein the integrated circuit component is a first integrated circuit component, the apparatus further comprising one or more second integrated circuit components attached to the printed circuit board.

Example 38 comprises the apparatus of example 37, wherein the one or more second integrated circuit components comprises a memory.

Example 39 comprises the apparatus of example 37, wherein the apparatus further comprises a housing enclosing the printed circuit board and the first integrated circuit component.

Example 40 is a method comprising: receiving one or more performance metrics indicating a performance level of one or more processor units located in an integrated circuit component, the integrated circuit component attached to a vapor chamber comprising: a casing defining an inner chamber, the inner chamber comprising: a working fluid comprising ferromagnetic particles; an inner surface; and a plurality of wire coils located on the inner surface; and causing current greater than a current threshold to flow through the one or more of the wire coils based on the performance metrics.

Example 41 comprises the method of example 40, wherein at least one of the performance metrics is provided by one of the processor units.

Example 42 comprises the method of example 40 or 41, wherein at least one of the performance metrics indicates an operating temperature of at least one of the processor units.

Example 43 comprises the method of any one of examples 40-42, wherein at least one of the performance metrics indicate an operating frequency of at least one of the processor units.

Example 44 comprises the method of any one of examples 40-43, wherein at least one of the performance metrics indicate an operating voltage of at least one of the processor units.

Example 45 comprises the method of any one of examples 40-44, wherein causing current to flow through one or more of the wire coils comprises: causing a first amount of current to flow through a first wire coil when first performance metrics of the performance metrics indicate that a first processor unit of the processor units is operating at a first power consumption level; and causing a second amount of current to flow through a second wire coil when one or more second performance metrics of the performance metrics indicate a second processor unit of the processor units is operating at a second performance level, the first power consumption level being different than the second performance level, the first amount of current being different than the second amount of current.

Example 46 comprises the method of any one of examples 40-44, wherein causing current to flow through one or more of the wire coils comprises causing an amount of current to flow through a first wire coil based on one or more first performance metrics of the performance metrics indicating a power consumption level of a first processor unit of the one or more processor units.

Example 47 comprises the method of example 46, wherein the amount of current is a first amount of current, the method further comprising: receiving one or more additional performance metrics associated with the first processor unit; and causing a second amount of current to flow to the first wire coil based on the one or more additional performance metrics, the first performance metrics indicating the first processor unit is operating at a first power consumption level, the one or more additional performance metrics indicating the first processor unit is operating at a second power consumption level, the first power consumption level being different than the second power consumption level, the first amount of current being different than the second amount of current.

Example 48 comprises the method of any one of examples 40-44, wherein a volumetric concentration of the ferromagnetic particles in the working fluid is a first value in a vicinity of a first wire coil when no current flows through the first wire coil and the volumetric concentration of the ferromagnetic particles in the working fluid is a second value in the vicinity of the first wire coil when an amount of current greater than a current threshold is caused to flow through the first wire coil, the second value greater than the first value.

Example 49 comprises the method of any one of examples 40-44, wherein a volumetric concentration of the ferromagnetic particles in the working fluid is a first value above a center of a first wire coil and a second value above an outermost winding of the first wire coil when an amount of current greater than a current threshold is caused to flow through the first wire coil.

Example 50 comprises the method of any one of examples 40-49, wherein the ferromagnetic particles are nanoscale ferromagnetic particles.

Example 51 comprises the method of any one of examples 40-49, wherein the ferromagnetic particles comprise one or more of iron, nickel, and cobalt.

Example 52 comprises the method of any one of examples 40-51, wherein the inner surface further comprises: a first region; and a second region surrounding the first region, the second region comprising one or more wicks.

Example 53 comprises the method of any one of examples 40-52, the inner surface comprising a plurality of recesses, individual of the wire coils located in one of the recesses.

Example 54 comprises the method of any one of examples 40-53, wherein the wire coils are arranged in a grid configuration.

Example 55 comprises the method of any one of examples 40-54, wherein the plurality of wire coils comprises a first wire coil having a first diameter and a second wire coil having a second diameter different than the first diameter.

Example 56 comprises the method of any one of examples 40-55, wherein an arrangement of one or more of the wire coils is based on an arrangement of one or more processor units of an integrated circuit component to which the vapor chamber is to be attached.

Example 57 comprises the method of any one of examples 40-56, wherein one of the wire coils comprises a ferrite core.

Example 58 comprises the method of any one of examples 40-57, wherein at least a portion of one of the wire coils is surrounded by a magnetic reflector.

Example 59 comprises the method of example 58, wherein a first portion of the magnetic reflector is positioned between the one of the wire coils and the inner surface and a second portion of the magnetic reflector surrounds an outermost winding of the one of the wire coils.

Example 60 comprises the method of any one of examples 40-59, wherein for individual of the wire coils, a layer comprising a magnetic material is located on top of the individual wire coil.

Example 61 is one or more computer-readable storage media storing computer-executable instructions that, when executed, cause a computing system to perform any one of the methods of examples 40-60.

Example 62 comprises a computing device comprising one or more means to perform any one of the methods of examples 40-60.

Example 63 comprises the apparatus of any one of examples 1-15 or 18-32, wherein the working fluid comprises water and alcohol.

Example 64 comprises the apparatus of any one of examples 1-15 or 18-32, wherein the working fluid comprises water and pentane.

Example 65 comprises the apparatus of any one of examples 1-15 or 18-32, wherein the working fluid comprises methanol.

Example 66 comprises the apparatus of any one of examples 1-15 or 18-32, wherein the working fluid comprises ethanol.

Example 67 comprises the apparatus of any one of examples 1-15 or 18-32, wherein the working fluid comprises water and propylene glycol.

Example 68 comprises the apparatus of any one of examples 1-15 or 18-32, wherein the working fluid comprises ammonia.

Example 69 comprises the apparatus of any one of examples 1-15 or 18-32, wherein the working fluid comprises ethane.

Example 70 comprises the apparatus of any one of examples 1-15 or 18-32, wherein the working fluid comprises acetone.

Example 71 comprises the apparatus of any one of examples 1-15 or 18-32, wherein the working fluid comprises pentane.

Example 72 comprises the apparatus of any one of examples 1-15 or 18-32, wherein the working fluid comprises refrigerant R-141b.

Example 73 comprises the apparatus of any one of examples 1-15 or 18-32, wherein the working fluid comprises refrigerant R-134a.

The invention claimed is:

1. An apparatus comprising:
- a casing defining an inner chamber, the inner chamber comprising:
  - a working fluid comprising ferromagnetic particles;
  - an inner surface; and
  - a plurality of wire coils located on the inner surface, wherein at least a portion of a wire coil of the plurality of wire coils is surrounded by a magnetic reflector, a first portion of the magnetic reflector positioned between the wire coil of the plurality of wire coils and the inner surface and a second portion of the magnetic reflector surrounding an outermost winding of the wire coil of the plurality of wire coils; and
- one or more connectors, individual of the one or more connectors conductively coupled to at least one of the plurality of wire coils.

2. The apparatus of claim 1, wherein a volumetric concentration of the ferromagnetic particles in the working fluid is a first value in a vicinity of a first wire coil when no current flows through the first wire coil and the volumetric concentration of the ferromagnetic particles in the working fluid is a second value in the vicinity of the first wire coil when an amount of current greater than a current threshold is caused to flow through the first wire coil, the second value greater than the first value.

3. The apparatus of claim 1, wherein a volumetric concentration of the ferromagnetic particles in the working fluid is a first value above a center of a first wire coil and a second value above an outermost winding of the first wire coil when an amount of current greater than a current threshold is caused to flow through the first wire coil.

4. The apparatus of claim 1, wherein the working fluid comprises:
- sodium dodecyl;
- lauryl sulfate;
- water and alcohol;
- water and pentane;
- methanol;
- ethanol;
- water and propylene glycol;
- ammonia;
- ethane;
- acetone;
- pentane;
- refrigerant R-141b; or
- refrigerant R-134a.

5. The apparatus of claim 1, wherein the plurality of wire coils comprises a first wire coil having a first diameter and a second wire coil having a second diameter different than the first diameter.

6. The apparatus of claim 1, wherein an arrangement of one or more of the plurality of wire coils is based on an arrangement of one or more processor units of an integrated circuit component to which the apparatus is to be attached.

7. An apparatus comprising:
- a vapor chamber comprising an inner chamber, the inner chamber comprising:
  - a working fluid comprising ferromagnetic particles;
  - an inner surface; and
  - a plurality of wire coils located on the inner surface;
- one or more connectors, individual of the one or more connectors conductively coupled to at least one of the plurality of wire coils;
- an integrated circuit component thermally coupled to the vapor chamber, the integrated circuit component comprising a plurality of processor units; and
- a coil controller to cause current to flow through one or more of the plurality of wire coils via the one or more connectors based on one or more performance metrics indicating a performance level of one or more of the plurality of processor units.

8. The apparatus of claim 7, wherein a volumetric concentration of the ferromagnetic particles in the working fluid is a first value in a vicinity of a first wire coil when no current flows through the first wire coil and the volumetric concentration of the ferromagnetic particles in the working fluid is a second value in the vicinity of the first wire coil when an amount of current greater than a current threshold is caused to flow through the first wire coil, the second value greater than the first value.

9. The apparatus of claim 7, wherein a volumetric concentration of the ferromagnetic particles in the working fluid is a first value above a center of a first wire coil and a second value above an outermost winding of the first wire coil when an amount of current greater than a current threshold is caused to flow through the first wire coil.

10. The apparatus of claim 7, wherein the plurality of processor units comprises at least one processor unit of a first processor unit type and at least one processor unit of a second processor unit type.

11. The apparatus of claim 7, wherein the integrated circuit component is further attached to a printed circuit board.

12. The apparatus of claim 11, wherein the integrated circuit component is a first integrated circuit component, the apparatus further comprising one or more second integrated circuit components attached to the printed circuit board.

13. The apparatus of claim 7, wherein the plurality of wire coils comprises a first wire coil having a first diameter and a second wire coil having a second diameter different than the first diameter.

14. A method comprising:
- receiving one or more performance metrics indicating a performance level of one or more processor units located in an integrated circuit component, the integrated circuit component attached to a vapor chamber comprising:
  - a casing defining an inner chamber, the inner chamber comprising:
    - a working fluid comprising ferromagnetic particles;
    - an inner surface; and
    - a plurality of wire coils located on the inner surface; and
  - one or more connectors, individual of the one or more connectors conductively coupled to at least one of the plurality of wire coils; and
- causing current greater than a current threshold to flow through one or more of the plurality of wire coils based on the one or more performance metrics.

15. The method of claim 14, wherein the one or more performance metrics indicate one or more of an operating frequency of at least one of the one or more processor units, an operating voltage of at least one of the one or more processor units, and an operating temperature of at least one of the one or more processor units.

16. The method of claim 14, wherein causing current to flow through one or more of the plurality of wire coils comprises:

causing a first amount of current to flow through a first wire coil when first performance metrics of the one or more performance metrics indicate that a first processor unit of the one or more processor units is operating at a first power consumption level; and causing a second amount of current to flow through a second wire coil when one or more second performance metrics of the one or more performance metrics indicate a second processor unit of the one or more processor units is operating at a second power consumption level, the first power consumption level being different than the second power consumption level, the first amount of current being different than the second amount of current.

17. The method of claim 14, wherein causing current to flow through one or more of the plurality of wire coils comprises causing an amount of current to flow through a first wire coil based on one or more first performance metrics of the one or more performance metrics indicating a power consumption level of a first processor unit of the one or more processor units.

18. The method of claim 17, wherein the amount of current is a first amount of current, the method further comprising:

receiving one or more additional performance metrics associated with the first processor unit; and causing a second amount of current to flow to the first wire coil based on the one or more additional performance metrics, the one or more first performance metrics indicating the first processor unit is operating at a first power consumption level, the one or more additional performance metrics indicating the first processor unit is operating at a second power consumption level, the first power consumption level being different than the second power consumption level, the first amount of current being different than the second amount of current.

19. The method of claim 14, wherein a volumetric concentration of the ferromagnetic particles in the working fluid is a first value in a vicinity of a first wire coil when no current flows through the first wire coil and the volumetric concentration of the ferromagnetic particles in the working fluid is a second value in the vicinity of the first wire coil when an amount of current greater than a current threshold is caused to flow through the first wire coil, the second value greater than the first value.

20. The method of claim 14, wherein a volumetric concentration of the ferromagnetic particles in the working fluid is a first value above a center of a first wire coil and a second value above an outermost winding of the first wire coil when an amount of current greater than a current threshold is caused to flow through the first wire coil.

21. One or more computer-readable storage media storing computer-executable instructions that, when executed, cause a computing system to:

receive one or more performance metrics indicating a performance level of one or more processor units located in an integrated circuit component, the integrated circuit component attached to a vapor chamber comprising:

a casing defining an inner chamber, the inner chamber comprising:

a working fluid comprising ferromagnetic particles;

an inner surface; and a plurality of wire coils located on the inner surface; and one or more connectors, individual of the one or more connectors conductively coupled to at least one of the plurality of wire coils; and cause current greater than a current threshold to flow through one or more of the plurality of wire coils based on the one or more performance metrics.

22. The one or more computer-readable storage media of claim 21, wherein the one or more performance metrics indicate one or more of an operating frequency of at least one of the one or more processor units, an operating voltage of at least one of the one or more processor units, and an operating temperature of at least one of the one or more processor units.

23. The one or more computer-readable storage media of claim 21, wherein to cause current to flow through one or more of the plurality of wire coils comprises:

causing a first amount of current to flow through a first wire coil when first performance metrics of the one or more performance metrics indicate that a first processor unit of the one or more processor units is operating at a first power consumption level; and causing a second amount of current to flow through a second wire coil when one or more second performance metrics of the one or more performance metrics indicate a second processor unit of the one or more processor units is operating at a second power consumption level, the first power consumption level being different than the second power consumption level, the first amount of current being different than the second amount of current.

24. The one or more computer-readable storage media of claim 21, wherein to cause current to flow through one or more of the plurality of wire coils comprises causing an amount of current to flow through a first wire coil based on one or more first performance metrics of the one or more performance metrics indicating a power consumption level of a first processor unit of the one or more processor units.

25. The one or more computer-readable storage media of claim 24, wherein the amount of current is a first amount of current, the computer-executable instructions, when executed, to further cause the computing system to:

receive one or more additional performance metrics associated with the first processor unit; and cause a second amount of current to flow to the first wire coil based on the one or more additional performance metrics, the one or more first performance metrics indicating the first processor unit is operating at a first power consumption level, the one or more additional performance metrics indicating the first processor unit is operating at a second power consumption level, the first power consumption level being different than the second power consumption level, the first amount of current being different than the second amount of current.

* * * * *